(12) United States Patent
Bhatia et al.

(10) Patent No.: US 8,194,248 B2
(45) Date of Patent: Jun. 5, 2012

(54) ALIGNMENT OPTIMIZATION FOR OPTICAL PACKAGES

(75) Inventors: Vikram Bhatia, Painted Post, NY (US); Steven Joseph Gregorski, Painted Post, NY (US); Fumio Nagai, Hachioji (JP); Yukihiro Ozeki, Kanagawa (JP)

(73) Assignees: Corning Incorporated, Corning, NY (US); Konica-Minolta, Tokyo (JP)

( * ) Notice: Subject to any disclaimer, the term of this patent is extended or adjusted under 35 U.S.C. 154(b) by 650 days.

(21) Appl. No.: 12/267,777

(22) Filed: Nov. 10, 2008

(65) Prior Publication Data

US 2010/0118306 A1    May 13, 2010

(51) Int. Cl.
*G01B 11/00* (2006.01)

(52) U.S. Cl. ............ 356/399; 356/401; 369/44.32; 385/33; 359/719; 359/666; 359/690

(58) Field of Classification Search .......... 356/399–401; 359/239, 719, 666, 690; 385/33; 369/112.07, 369/328, 112.03, 112.23; 348/342
See application file for complete search history.

(56) References Cited

U.S. PATENT DOCUMENTS

| | | | | |
|---|---|---|---|---|
| 5,063,568 A | * | 11/1991 | Chiba et al. | 372/32 |
| 5,301,059 A | * | 4/1994 | Kitaoka et al. | 359/332 |
| 6,724,486 B1 | * | 4/2004 | Shull et al. | 356/486 |
| 7,221,492 B2 | * | 5/2007 | Mori et al. | 359/205.1 |
| 2007/0091411 A1 | | 4/2007 | Mori et al. | 359/239 |
| 2007/0170348 A1 | | 7/2007 | Kito et al. | 250/205 |
| 2008/0193083 A1 | * | 8/2008 | Nagai et al. | 385/33 |
| 2008/0240181 A1 | | 10/2008 | Shibatani | 372/29.014 |

* cited by examiner

*Primary Examiner* — Tarifur Chowdhury
*Assistant Examiner* — Isiaka Akanbi
(74) *Attorney, Agent, or Firm* — Michael W. Russell

(57) ABSTRACT

Methods of optimizing optical alignment in an optical package are provided. In one embodiment, the optical package includes a laser diode, a wavelength conversion device, coupling optics positioned along an optical path extending from the laser diode to the wavelength conversion device, and one or more adaptive actuators. The method involves adjusting the optical alignment of the wavelength conversion device in a non-adaptive degree of freedom by referring to a thermally-dependent output intensity profile of the laser diode and a thermally-dependent coupling efficiency profile of the optical package. The adjustment in the non-adaptive degree of freedom is quantified such that, over a given operating temperature range of the optical package, portions of the coupling efficiency profile characterized by relatively low coupling efficiency offset portions of the output intensity profile characterized by relatively high laser output intensity and portions of the coupling efficiency profile characterized by relatively high coupling efficiency offset portions of the output intensity profile characterized by relatively low laser output intensity. Additional embodiments are disclosed and claimed.

19 Claims, 2 Drawing Sheets

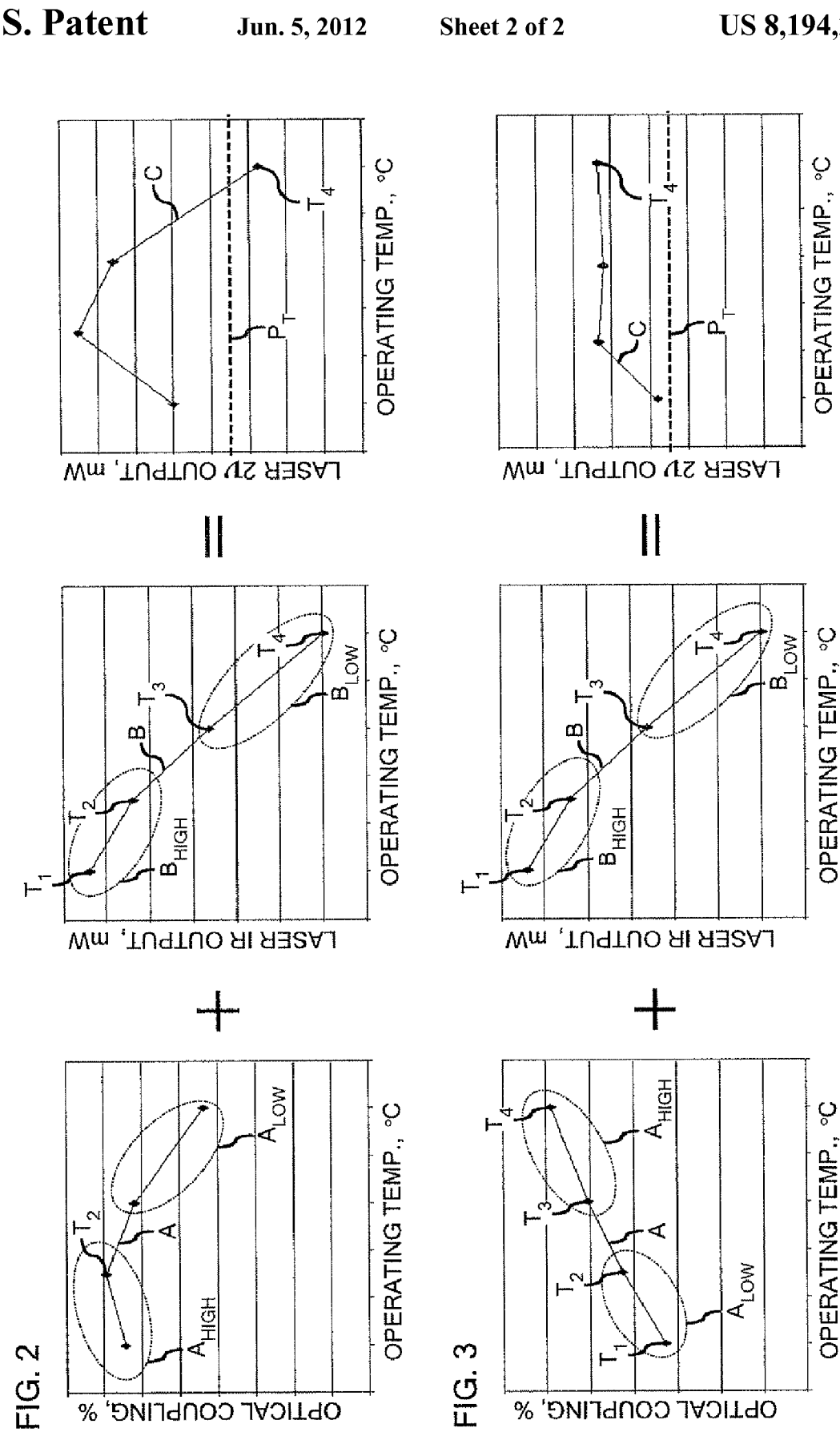

ALIGNMENT OPTIMIZATION FOR OPTICAL PACKAGES

BACKGROUND

The present disclosure generally relates to optical packages incorporating semiconductor lasers and complementary optical components to be optically-aligned with the semiconductor laser. More specifically, the present disclosure relates to methods for tailoring the temperature-dependent alignment of optical packages that include, inter alia, a semiconductor laser and a second harmonic generation (SHG) crystal or another type of wavelength conversion device.

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second or third harmonic generation crystal. Typically, the crystal is used to generate higher harmonic waves of the fundamental laser signal. To do so, the lasing wavelength is preferably tuned to the spectral center of the wavelength converting crystal and the output of the laser is optically-aligned with the waveguide portion of the crystal at the input face of the crystal.

SUMMARY

Waveguide optical mode field diameters of typical second harmonic generation (SHG) crystals, such as MgO-doped periodically poled lithium niobate (PPLN) crystals, can be in the range of a few microns. As a result, the present inventors have recognized that it can be very challenging to properly align the beam from the laser diode with the waveguide of the SHG crystal and maintain the alignment over the lifetime of the optical package and over large operational temperature variations. For example, optical misalignments in an optical package can be manifested as a focus error or a lateral misalignment of a beam spot on the input face of the crystal. Accordingly, the respective positions of the laser, the coupling optics, the crystal, etc., relative to the X, Y, and Z axes of the package, can collectively play a role in the optical alignment of the package.

Micro-opto-electromechanical systems (MOEMS), micro-electrical mechanical systems (MEMS), or similar actuator systems can be operatively coupled to the laser, the coupling optics, the crystal, or any of the other optical components of the optical package to establish or maintain optical alignment but the extensive use of actuators of this nature can be expensive and difficult to effectuate. In accordance with one embodiment, a method of optimizing optical alignment in an optical package is provided. The optical package comprises a laser diode, a wavelength conversion device, coupling optics positioned along an optical path extending from the laser diode to the wavelength conversion device, and one or more adaptive actuators. The method comprises adjusting the optical alignment of the wavelength conversion device in a non-adaptive degree of freedom by referring to a thermally-dependent output intensity profile of the laser diode and a thermally-dependent coupling efficiency profile of the optical package. The adjustment in the non-adaptive degree of freedom is quantified such that, over a given operating temperature range of the optical package, portions of the coupling efficiency profile characterized by relatively low coupling efficiency offset portions of the output intensity profile characterized by relatively high laser output intensity and portions of the coupling efficiency profile characterized by relatively high coupling efficiency offset portions of the output intensity profile characterized by relatively low laser output intensity.

In accordance with another embodiment, a method of optimizing optical alignment in an optical package is provided where the optical alignment of the wavelength conversion device is adjusted in a non-adaptive degree of freedom to enhance stability in the wavelength-converted output intensity of the optical package over a given operating temperature range of the package. Stability is enhanced by tailoring the thermally-dependent coupling efficiency profile of the optical package to favor increased optical coupling efficiency for relatively high operating temperatures. The adjustment of the optical alignment of the wavelength conversion device can be executed during assembly or calibration of the optical package and the respective positions of the laser diode, the coupling optics, and the wavelength conversion device in the non-adaptive degree of freedom can be fixed after assembly or calibration.

BRIEF DESCRIPTION OF THE DRAWINGS

The following detailed description of specific embodiments can be best understood when read in conjunction with the following drawings, where like structure is indicated with like reference numerals and in which:

FIG. 2 is an illustration of a detrimental optical package alignment, as manifested in the frequency-converted output of the optical package; and FIG. 3 is an illustration of an optimized optical package alignment, as manifested in the frequency-converted output of the optical package.

DETAILED DESCRIPTION

Figure 1:
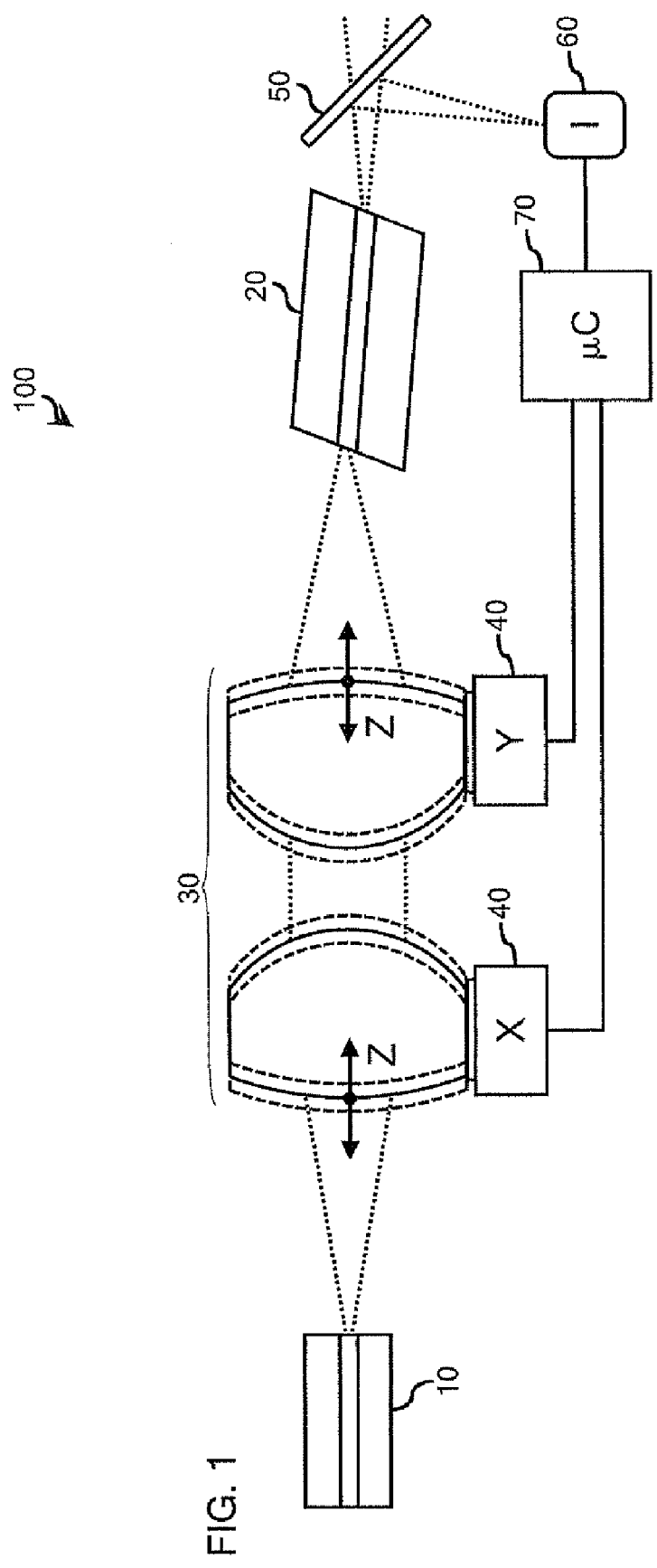
FIG. 1 is a schematic illustration of one of the many contemplated optical packages that are suitable for practicing the optical alignment methodology disclosed herein.

Referring initially to FIG. 1, methods of optimizing optical alignment in a variety of wavelength-converted optical packages can be illustrated with reference to optical package 100 comprising a laser diode 10, a wavelength conversion device 20, coupling optics 30 positioned along an optical path extending from the laser diode 10 to the wavelength conversion device 20, and one or more adaptive actuators 40 coupled to the coupling optics 30. Although in the illustrated embodiment a dual axis adaptive actuator 40 is coupled to each component of the coupling optics 30, less complex designs are contemplated where the adaptive actuator(s) 40 can be a single- or dual-axis actuator and can be coupled to one or more components of the coupling optics 30. In addition, it is contemplated that the adaptive actuator 40 can be coupled to any one or combination of optical components of the optical package 100 including, for example, the laser diode 10 or the wavelength conversion device 20.

In the embodiment illustrated in FIG. 1, each adaptive actuator 40 comprises a dual-axis actuator and defines two adaptive degrees of freedom in which optical alignment can be adjusted. These adaptive degrees of freedom are illustrated schematically in FIG. 1 as the X and Y directions. The adaptive degrees of freedom are referred to as "adaptive" herein because adjustment along the X and Y directions can be effectuated through the operation of the adaptive actuators 40. In contrast, there is no provision in the optical package for actuator-enabled adjustment of optical alignment along the non-adaptive degree of freedom in the direction of the Z-axis, which is orthogonal to the X and Y directions. The alignment of the optical package 100 can be optimized by adjusting the alignment of the wavelength conversion device 20 in the non-adaptive degree of freedom, which is illustrated in FIG. 1 along the direction of the Z-axis, and the adaptive degrees of freedom, which are illustrated in FIG. 1 along the X- and Y-axes.

Referring to FIGS. 2 and 3, to adjust optical alignment of the wavelength conversion device 20 in the non-adaptive degree of freedom, reference is made to the thermally-dependent coupling efficiency profile A of the optical package 100 and to the thermally-dependent output intensity profile B of the laser diode 10. As is illustrated in FIG. 2, absent optimization, the output intensity profile C of the optical package, which is primarily a function of the thermally-dependent coupling efficiency profile A and the thermally-dependent output intensity profile B, can vary widely over a typical operating temperature range, e.g., from approximately 10° C. to approximately 60° C. However, these types of intensity variations can be significantly mitigated by executing a suitable adjustment in the non-adaptive degree of freedom of the optical package.

Specifically, as is illustrated in FIG. 3, stability in the wavelength-converted output intensity C can be enhanced over a given operating temperature range, e.g., from approximately 10° C. to approximately 60° C., if the adjustment of the wavelength conversion device 20 in the non-adaptive degree of freedom is quantified such that: (i) relatively low coupling efficiency portions $A_{LOW}$ of the coupling efficiency profile A can offset relatively high laser output intensity portions $B_{HIGH}$ of the output intensity profile B and (ii) relatively high coupling efficiency portions $A_{HIGH}$ of the coupling efficiency profile A can offset relatively low laser output intensity portions $B_{LOW}$ of the output intensity profile B. To create the aforementioned offset relationship between the coupling efficiency profile A and the output intensity profile B, the thermally-dependent coupling efficiency profile A of the optical package 100 is tailored to complement the output intensity profile B of the laser diode 10. For example, the optical alignment of the wavelength conversion device 20 can be adjusted in the non-adaptive degree of freedom so that, at room temperature, the coupling efficiency of the wavelength conversion device 20 is about 10% to about 20% less than its peak value. The output intensity profile B follows the operating characteristics of the laser diode 10 and cannot be tailored as readily as the coupling efficiency profile A.

As is illustrated in FIGS. 2 and 3, a thermally-dependent coupling efficiency profile A can exhibit relatively low coupling efficiency portions $A_{LOW}$ and relatively high coupling efficiency portions $A_{HIGH}$. The location and extent of these portions of the coupling efficiency profile A, relative to operating temperature, will vary as a function of the manner in which the position of the wavelength conversion device 20 along the optical path is determined. For example, in FIG. 2 the wavelength conversion device 20 is aligned along the non-adaptive degree of freedom, i.e., the Z-axis, to optimize coupling efficiency at $T_2$ while efficiency drops off above and below $T_2$. In contrast, referring to FIG. 3, the wavelength conversion device 20 is aligned along the non-adaptive degree of freedom, i.e., the Z-axis, such that coupling efficiency continuously increases over a relatively wide operating temperature range, i.e., from $T_1$ to $T_4$. In this manner, the thermally-dependent coupling efficiency profile A of the optical package 100 can be tailored to favor increased optical coupling efficiency for operating temperatures where the thermally-dependent output intensity profile B of the laser diode 10 shows decreased output intensity, i.e., from $T_1$ to $T_4$.

Admittedly, the aforementioned adjustment in the non-adaptive degree of freedom will yield less than maximum conversion at certain temperatures, e.g., at $T_1$, $T_2$ and $T_3$ in FIG. 3. However, the resulting output intensity profile C illustrated in FIG. 3 shows significant athermalization in the optical package 100 because the wide-intensity variations otherwise present in the output intensity profile C of FIG. 2 are significantly mitigated and can be attributed to the aforementioned adjustment in the non-adaptive degree of freedom. In addition, although the wavelength-converted output power at the aforementioned temperatures may be lower than some of the maxima illustrated in FIG. 2, absent the alignment optimization described herein, one of the maxima $T_4$ illustrated in FIG. 2 could conceivably fall below a predetermined minimum power threshold $P_T$ while the corresponding maximum $T_4$ in the resulting output intensity profile C illustrated in FIG. 3 would stay well above the minimum power threshold $P_T$. Accordingly, the alignment optimization methodology described herein can also be used to keep wavelength-converted output intensity profiles above predetermined minimum power thresholds $P_T$.

Typically, the optical alignment of the wavelength conversion device 20 in the non-adaptive degree of freedom is executed during assembly or calibration of the optical package 100 and can be fixed after assembly or calibration. During operation of the optical package 100, the adaptive actuators 40 are used to make adjustments in the adaptive degrees of freedom to maximize the wavelength-converted output intensity of the optical package 100. Typically, adjustments in the non-adaptive degree of freedom are manifested as focus adjustments of a beam spot from the laser diode 10 on the input face of the wavelength conversion device 20. Adjustments in the adaptive degrees of freedom are manifested as lateral adjustments of the position of the beam spot on the input face of the wavelength conversion device 20.

In FIG. 1, the alignment of the wavelength conversion device 20 is adjusted by manually adjusting the position of the lens components of the coupling optics 30 along the direction of the Z-axis and by using the adaptive actuators 40 to position the lens components of the coupling optics 30 in the X/Y plane. Alternatively, the alignment of the wavelength conversion device 20 can be adjusted by establishing adaptive and non-adaptive degrees of freedom along any of a variety of orthogonal or non-orthogonal linear or rotational axes, including tilted orthogonal axes. For example, a relatively simple variation of the scheme of FIG. 1 would involve adjustment of the alignment of the wavelength conversion device by manually adjusting the position of the lens components of the coupling optics 30 along the direction of the Y-axis and by using the adaptive actuators 40 to position the lens components of the coupling optics 30 in the X/Z plane. It is also contemplated that the methodology described herein may merely involve establishing a single adaptive degree of freedom, e.g., along the X-axis, and a single non-adaptive degree of freedom, i.e., along the Z-axis. Further alternatives for adjusting the alignment of the wavelength conversion device 20 can utilize manual positioning and adaptive actuators to position and reposition the laser diode 10, the wavelength conversion device 20, or various combinations of the different components of the optical package 100.

In practice, it is contemplated that it will be advantageous to provide the optical package 100 with a partial beam splitter 50, an associated optical intensity monitor 60, and a programmable controller 70 to enable those practicing the methodology described herein to monitor the wavelength-converted output intensity of the optical package 100 and make suitable alignment adjustments in the adaptive degrees of freedom. These features would be particularly useful in making appropriate adjustments to the optical alignment of the wavelength conversion device 20 in the adaptive degrees of freedom because it would enable optimization of the wavelength-converted output intensity of the optical package 100 as adjustments are made. Typically, the aforementioned adjustments in the non-adaptive degree of freedom are excluded in operation of the device and are replaced by operations where the monitored wavelength-converted output intensity is used to make adjustments in the adaptive degrees of freedom of the package 100.

Having described the invention in detail and by reference to specific embodiments thereof, it will be apparent that modifications and variations are possible without departing from the scope of the invention defined in the appended claims. For example, although the concepts of the present disclosure are illustrated with reference to an optical package including relatively simple optical components of relatively straightforward design, it is contemplated that the concepts of the present disclosure may be practiced in a variety of optical packages including those with conventional optical elements arranged in conventional optical configurations, additional or fewer optical elements arranged in new or conventional optical configurations, or novel optical elements introduced to simplify or otherwise improve the illustrated optical configuration. In any case, the alignment optimization methodology of the present invention should not be limited exclusively to application with the illustrated optical configuration.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of optimizing optical alignment in an optical package comprising a laser diode, a wavelength conversion device, coupling optics positioned along an optical path extending from the laser diode to the wavelength conversion device, and one or more adaptive actuators coupled to the laser diode, the coupling optics, the wavelength conversion device, or combinations thereof, the method comprising:

adjusting the optical alignment of the wavelength conversion device in a non-adaptive degree of freedom during assembly or calibration of the optical package by referring to a thermally-dependent output intensity profile of the laser diode and a thermally-dependent coupling efficiency profile of the optical package, wherein the adjustment in the non-adaptive degree of freedom is quantified such that, over a given operating temperature range of the optical package, portions of the coupling efficiency profile characterized by relatively low coupling efficiency offset portions of the output intensity profile characterized by relatively high laser output intensity and portions of the coupling efficiency profile characterized by relatively high coupling efficiency offset portions of the output intensity profile characterized by relatively low laser output intensity; and utilizing the adaptive actuator to adjust the optical alignment of the wavelength conversion device in at least one adaptive degree of freedom wherein the adjustment in the adaptive degree of freedom is quantified to optimize a wavelength-converted output intensity of the optical package.

2. A method as claimed in claim 1, wherein the respective positions of the laser diode, the coupling optics, and the wavelength conversion device in the non-adaptive degree of freedom are fixed after assembly or calibration of the optical package.

3. A method as claimed in claim 2, wherein given a particular fixed adjustment in the non-adaptive degree of freedom, the adjustment in the adaptive degree of freedom by the adaptive actuator is quantified to maximize the wavelength-converted output intensity of the optical package.

4. A method as claimed in claim 1, wherein adjustment of the optical alignment of the wavelength conversion device in the non-adaptive degree of freedom is excluded during operation of the optical package.

5. A method as claimed in claim 1, wherein the adjustment in the non-adaptive degree of freedom is quantified to enhance stability in the wavelength-converted output intensity of the optical package over the given operating temperature range of the package by tailoring the thermally-dependent coupling efficiency profile of the optical package.

6. A method as claimed in claim 5, wherein the thermally-dependent coupling efficiency profile of the optical package is tailored to favor increased optical coupling efficiency for operating temperatures where the thermally-dependent output intensity profile of the laser diode shows decreased output intensity.

7. A method as claimed in claim 1, wherein the adjustment in the non-adaptive degree of freedom is quantified such that the wavelength-converted output intensity of the optical package is less than a maximum available wavelength-converted output intensity over a portion of the given operating temperature range.

8. A method as claimed in claim 1, wherein the adjustment in the non-adaptive degree of freedom is quantified such that the wavelength-converted output intensity of the optical package is less than a maximum available wavelength-converted output intensity of the optical package over an approximate majority of operating temperatures of the optical package.

9. A method as claimed in claim 1, wherein:

the adjustment of the optical alignment of the wavelength conversion device in the non-adaptive degree of freedom is manifested as a focus adjustment of a beam spot from the laser diode on the input face of the wavelength conversion device; and the adjustment of the optical alignment of the wavelength conversion device in the adaptive degree of freedom is manifested as a lateral adjustment of the position of a beam spot from the laser diode on the input face of the wavelength conversion device.

10. A method as claimed in claim 1, wherein the adjustment of the optical alignment of the wavelength conversion device in the non-adaptive and adaptive degrees of freedom is executed by positioning the laser diode, the coupling optics, the wavelength conversion device, or combinations thereof within the optical package.

11. A method as claimed in claim 1, wherein:
the adjustment of the optical alignment of the wavelength conversion device in the non-adaptive degree of freedom is affected through movement of one or more optical components of the optical package in a Z direction along the optical path of the optical package; and
the adjustment of the optical alignment of the wavelength conversion device in the adaptive degree of freedom is affected through movement of one or more optical components of the optical package in X, Y, or X and Y directions orthogonal to the Z direction of the optical path.

12. A method as claimed in claim 1, wherein the optical package further comprises an optical intensity monitor and the method comprises:
utilizing the optical intensity monitor to monitor the wavelength-converted output intensity of the optical package; and
adjusting the optical alignment of the wavelength conversion device in the adaptive degree of freedom while monitoring the wavelength-converted output intensity to optimize the wavelength-converted output intensity of the optical package.

13. A method as claimed in claim 12, wherein adjustment in the non-adaptive degree of freedom is excluded during the monitoring of the wavelength-converted output intensity and the adjustment in the adaptive degree of freedom.

14. A method as claimed in claim 1, wherein the adaptive actuator comprises a dual-axis positioner.

15. A method as claimed in claim 1, wherein the optical alignment of the wavelength conversion device is adjusted in the non-adaptive degree of freedom so that, at room temperature, the coupling efficiency of the wavelength conversion device is about 10% to about 20% less than its peak value.

16. A method of optimizing optical alignment in an optical package comprising a laser diode, a wavelength conversion device, coupling optics positioned along an optical path extending from the laser diode to the wavelength conversion device, and one or more adaptive actuators coupled to the laser diode, the coupling optics, the wavelength conversion device, or combinations thereof, the method comprising:
adjusting the optical alignment of the wavelength conversion device in a non-adaptive degree of freedom to enhance stability in the wavelength-converted output intensity of the optical package over a given operating temperature range of the package by tailoring the thermally-dependent coupling efficiency profile of the optical package to favor increased optical coupling efficiency for relatively high operating temperatures, wherein adjustment of the optical alignment of the wavelength conversion device in the non-adaptive degree of freedom is executed during assembly or calibration of the optical package and the respective positions of the laser diode, the coupling optics, and the wavelength conversion device in the non-adaptive degree of freedom are fixed after assembly or calibration of the optical package; and
utilizing the adaptive actuator to adjust the optical alignment of the wavelength conversion device in at least one adaptive degree of freedom wherein the adjustment in the adaptive degree of freedom is quantified to optimize a wavelength-converted output intensity of the optical package.

17. A method as claimed in claim 16, wherein given a particular fixed adjustment in the non-adaptive degree of freedom, the adjustment in the adaptive degree of freedom by the adaptive actuator is quantified to maximize the wavelength-converted output intensity of the optical package.

18. A method as claimed in claim 16, wherein the adjustment in the non-adaptive degree of freedom is quantified to enhance stability in the wavelength-converted output intensity of the optical package over the given operating temperature range of the package by tailoring the thermally-dependent coupling efficiency profile of the optical package.

19. A method as claimed in claim 18, wherein the thermally-dependent coupling efficiency profile of the optical package is tailored to favor increased optical coupling efficiency for operating temperatures where the thermally-dependent output intensity profile of the laser diode shows decreased output intensity.

* * * * *